(12) United States Patent
Kim

(10) Patent No.: US 7,791,266 B2
(45) Date of Patent: Sep. 7, 2010

(54) ORGANIC ELECTROLUMINESCENT DISPLAY HAVING LOW DATA LINE CAPACITANCE

(75) Inventor: Yang-Wan Kim, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 297 days.

(21) Appl. No.: 11/521,703

(22) Filed: Sep. 15, 2006

(65) Prior Publication Data
US 2010/0133988 A1 Jun. 3, 2010

(30) Foreign Application Priority Data
Sep. 16, 2005 (KR) .................. 10-2005-0086682

(51) Int. Cl.
*H01J 63/04* (2006.01)
*H01J 1/62* (2006.01)
(52) U.S. Cl. .................. 313/503; 313/483; 313/504; 313/505; 313/506; 313/509
(58) Field of Classification Search ........... None
See application file for complete search history.

(56) References Cited
U.S. PATENT DOCUMENTS
7,088,417 B2 * 8/2006 Kamijima et al. .......... 349/152

2005/0057460 A1 * 3/2005 Lee et al. .................. 345/76
2006/0097628 A1 * 5/2006 Suh et al. .................. 313/504

FOREIGN PATENT DOCUMENTS

| JP | 2003-347558 | 12/2003 |
|---|---|---|
| KR | 10-2004-0033395 | 4/2004 |
| KR | 10-2005-0005198 | 1/2005 |
| KR | 10-2005-0021718 | 3/2005 |

OTHER PUBLICATIONS

Korean Registration Certificate KR10-2005-0005198 issued on May 18, 2007 by the Korean Intellectual Property Office in connection with corresponding Korean Patent Application No. 10-2005-0086682.

* cited by examiner

*Primary Examiner*—Nimeshkumar D. Patel
*Assistant Examiner*—Natalie K Walford
(74) *Attorney, Agent, or Firm*—Knobbe Martens Olson & Bear LLP

(57) ABSTRACT

An organic electroluminescent display in which a power supply line for a power supply voltage is separated from data lines for data signals in a signal input portion is disclosed. The power supply line over the data lines is employed as a pixel electrode or a cathode to supply the power supply voltage. This arrangement decreases the parasitic capacitance between the two lines and reduces load on the data lines.

20 Claims, 4 Drawing Sheets

ORGANIC ELECTROLUMINESCENT DISPLAY HAVING LOW DATA LINE CAPACITANCE

CROSS-REFERENCE TO RELATED APPLICATION

This application claims the benefit under 35 U.S.C. §119 (a) of Korean Patent Application No. 10-2005-0086682, filed Sep. 16, 2005 the entire disclosure of which is hereby incorporated by reference.

BACKGROUND OF THE INVENTION

1. Field of the Invention

The present invention relates to an organic electroluminescent display, and more particularly, to an organic electroluminescent display having a signal input portion including power supply lines for receiving a power supply voltage and data lines for receiving data signals, the power supply line and data line being separated from each other by an optimal distance difference or gap to prevent unnecessary parasitic capacitance.

2. Description of the Related Technology

Generally, an organic electroluminescent display is a flat panel display that emits light when an electric field is applied to a fluorescent material formed on a glass substrate or a transparent organic film. The phenomenon of the fluorescent material (which may be a semiconductor) emitting light when placed in an electric field is known as electroluminescence.

Recently, a liquid crystal display (LCD), an organic electroluminescent display (OLED), and the like have widely been used in mobile information devices because they are, among other benefits, lightweight, and thin. The organic electroluminescent display, whose brightness and viewing angle are superior to the LCD, has attracted much attention.

Typically, an active matrix organic electroluminescent display (AMOLED) includes a pixel with red (R), green (G) and blue (B) sub-pixels. Each of the R, G and B sub-pixels includes an organic electroluminescent diode. Each organic electroluminescent diode includes an anode, a cathode, and an R, G or B organic emission layer interposed between the anode and the cathode. When a voltage is applied between the anode and the cathode, light is emitted from an organic layer formed of the R, G or B organic emission layer corresponding to the color of the organic emission layer.

Further, the AMOLED drives N×M organic electroluminescent diodes by using a voltage programming method or a current programming method.

FIG. 1 is a cross-sectional view of a signal input portion for applying a signal to a display panel portion in a conventional organic electroluminescent display.

Referring to FIG. 1, the cross-sectional view of the display panel portion in the organic electroluminescent display has data lines portion Z for receiving data signals, a first power supply line portion X, and a second power supply line portion Y for receiving a power supply voltage at both sides of the data lines portion Z.

Further, FIG. 1 illustrates a plurality of data lines connecting a data driver and a display panel provided in the display panel portion of the conventional organic electroluminescent display. Here, the plurality of data lines are arranged in a spider tie shape, which is a simple shape made by lines evenly diverging away from a center line, to transmit predetermined data signals to the display panel.

To manufacture a display panel portion like the embodiment shown in FIG. 1, firstly, a substrate 100 formed of glass, synthetic resin or the like is prepared. Then, one of a silicon dioxide ($SiO_2$) layer, a silicon nitride ($SiN_x$) layer, and a stacked layer of the silicon dioxide/nitride layer is formed as a buffer layer 110 on the substrate 100, which prevents impurities from outflowing from the substrate 100.

Here, the buffer layer 110 is not essential, and therefore sometimes not used

Then, a gate insulating layer 120 is formed on the entire surface of the substrate 100, and a plurality of data lines 130 are patterned across the surface of the substrate 100 at regular intervals to apply the data signals to the display panel.

Here, the data lines are formed of at least one of chrome (Cr), molybdenum (Mo), aluminum (Al), silver (Ag), and alloys thereof.

Then, an interlayer-insulating layer 140 is formed on the gate insulating layer 120 and the plurality of data lines 130 across the surface of the substrate 100. A predetermined power supply electrode is then formed on the entire surface of the interlayer-insulating layer 140. Thus, a predetermined power supply line 150 is formed by depositing the power supply electrode in the first power supply line portion X, the second power supply line portion Y, and the data lines portion Z.

Accordingly, parasitic capacitance C is formed between each of the plurality of data lines 130 and the power supply line 150. The parasitic capacitance C causes load artifacts such as signal loss, signal distortion, signal delay, and overpower which deteriorate the emission characteristics of the organic electroluminescent display.

Here, the power supply line is formed of at least one of chrome (Cr), tungsten (W), molybdenum (Mo), aluminum (Al), silver (Ag), and alloys thereof.

Then, one of a silicon dioxide ($SiO_2$) layer, a silicon nitride ($SiN_x$) layer, and a stacked layer of the silicon dioxide layer/nitride layer is formed as a passivation layer 160 completely covering the power supply line 150 formed in the first power supply line portion X, the second power supply line portion Y, and the data lines portion Z.

Then, at least one of an acryl resin, a benzo-cyclo-butene (BCB) resin, a polyimid (PI) resin, a spin on glass (SOG) resin, an acrylate resin, a poly phenol resin, and the like is formed as an organic layer, i.e., a planarization layer 170, on the passivation layer 160.

Then, a pixel defining layer (PDL) 180 is formed on the entire surface of the planarization layer 170. The pixel defining layer 180 is formed of at least one organic material such as an acryl resin, a benzo-cyclo-butene (BCB) resin, a polyimid (PI) resin, a spin on glass (SOG) resin, an acrylate resin, and a poly phenol resin.

In the foregoing described signal input portion of the conventional organic electroluminescent display, the gap between the power supply line and the data lines is so narrow that the resulting parasitic capacitance increases the load, thereby causing signal loss, signal distortion, signal delay, and the like.

SUMMARY OF CERTAIN INVENTIVE ASPECTS

The present invention provides an organic electroluminescent display in which a power supply line and data lines formed in a signal input portion are separated from each other by a gap to reduce parasitic capacitance.

One embodiment is a organic electroluminescent display including a substrate with a signal input portion configured to supply data signals and a power supply voltage to a plurality of pixels, a plurality of data lines arranged on a gate insulating layer formed on the substrate, an interlayer-insulating layer formed over the plurality of data lines, a passivation layer formed on the interlayer-insulating layer, a pixel electrode formed on the passivation layer, and a pixel defining layer formed on the pixel electrode, where the pixel electrode is configured to supply the power supply voltage to the plurality of pixels.

Another embodiment is a organic electroluminescent display including a substrate with a signal input portion configured to supply data signals and a power supply voltage to a plurality of pixels, a plurality of data lines arranged on the substrate, an interlayer-insulating layer formed on the plurality of data lines, a passivation layer formed on the interlayer-insulating layer, a pixel defining layer formed on the passivation layer, and a cathode formed on the pixel defining layer, where the cathode is configured to supply the power supply voltage to the plurality of pixels.

Another embodiment is a organic electroluminescent display including a substrate, a plurality of data lines arranged on the substrate, where the data lines are configured to supply data signals to the plurality of pixels, a passivation layer formed over the data lines, and a pixel electrode formed over the passivation layer, where the pixel electrode is configured to supply a power supply voltage to the plurality of pixels.

BRIEF DESCRIPTION OF THE DRAWINGS

The above and other features and advantages of the present invention will become more apparent with description of certain embodiments with reference to the attached drawings in which.

DETAILED DESCRIPTION OF CERTAIN INVENTIVE EMBODIMENTS

Figure 2:
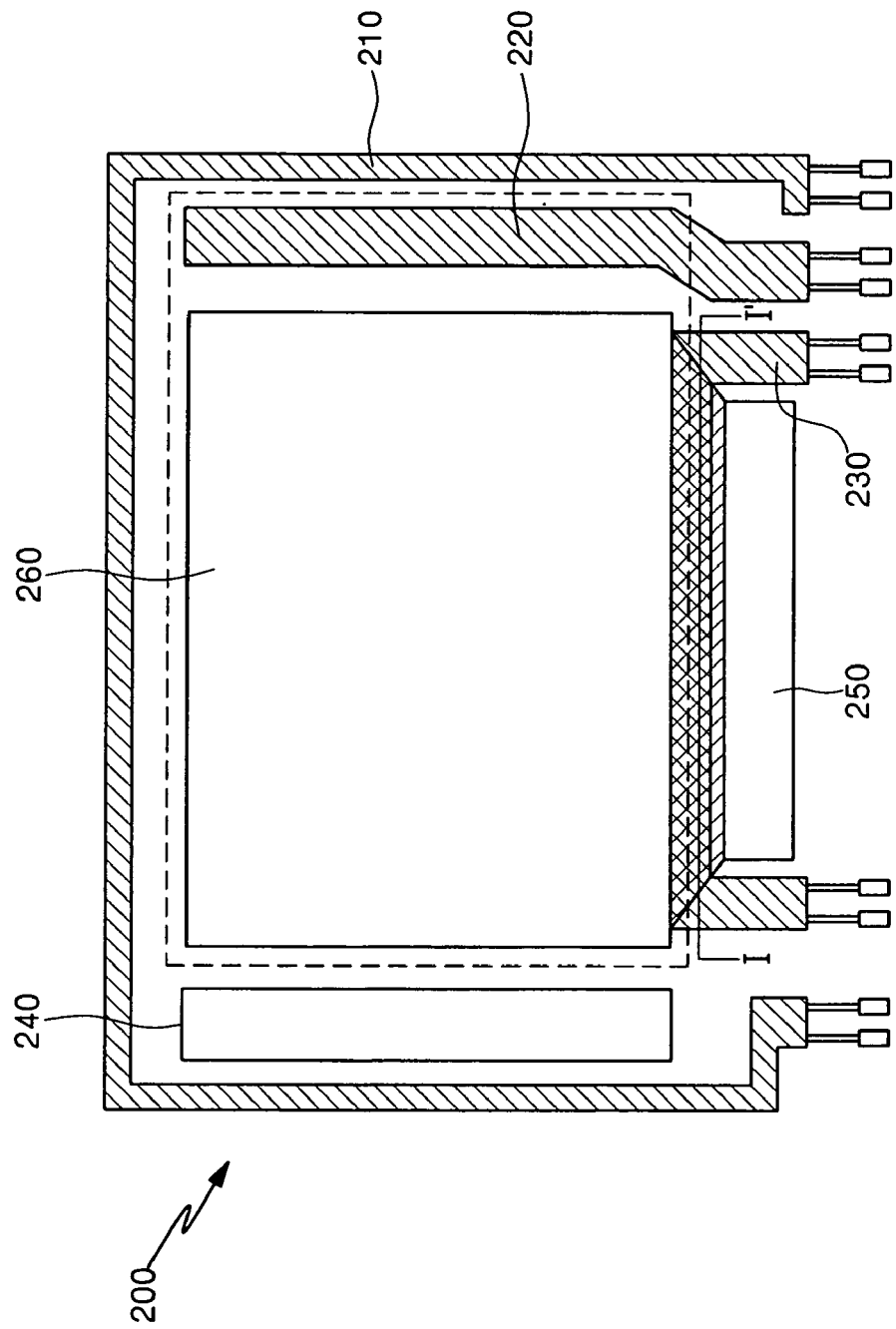
FIG. 2 is a plan view of a display panel portion provided in an organic electroluminescent display according to one embodiment.

FIG. 2 is a plan view of a display panel portion provided in an organic electroluminescent display according to an embodiment.

Referring to FIG. 2, the display panel portion 200 of the organic electroluminescent display includes a display panel 260 having a plurality of pixels; an upper power supply line 210 disposed at an upper part of the display panel 260 and configured to apply a power supply voltage VDD to the display panel 260; a lower power supply line 230 disposed at a lower part of the display panel 260 and configured to apply the power supply voltage VDD to the display panel 260; a reference power supply line 220 disposed at a first side of the display panel 260 and configured to apply a reference voltage VSS to the display panel 260; a scan driver 240 disposed at a second side of the display panel 260 and configured to output scan signals; and a data driver 250 formed under the lower power supply line 230 and configured to apply data signals to the display panel 260.

The display panel 260 includes the plurality of pixels formed in regions near intersections of a plurality of scan lines and a plurality of data lines. Each pixel includes R, G and B sub-pixels and receives the data signals from the data lines and the scan signals from the scan lines.

Further, the R, G and B sub-pixels have a pixel circuit, and emit red, green and blue light corresponding to signals applied to an organic electroluminescent diode, wherein a combined color is displayed.

The upper power supply line 210 is used to apply the predetermined power supply voltage VDD to the plurality of pixels in the display panel 260. Here, the upper power supply line 210 is connected to the plurality of pixels and applies the power supply voltage VDD generated from a power supply source to the plurality of pixels.

The lower power supply line 230 is used to apply the power supply voltage VDD to the plurality of pixels in the display panel 260, similar to the upper power supply line 210. Here, the lower power supply line 230 is connected to the plurality of pixels and applies the power supply voltage VDD generated from the predetermined power supply source to the plurality of pixels. Further, the lower power supply line 230 and the upper power supply line 210 do not receive separate voltages, respectively but receive the same power supply voltage VDD. Accordingly, the upper power supply line 210 and the lower power supply line output the same power supply voltage VDD. Thus, the lower power supply line 230 and the upper power supply line 210 are internally connected so that the power supply voltage VDD is applied to the plurality of pixels of the display panel 160.

The reference power supply line 220 is used to apply the predetermined reference voltage VSS to the plurality of pixels in the display panel 260. Here, the reference power supply line 220 is connected to the plurality of pixels in the display panel 260 and applies the reference voltage VSS generated from the predetermined power supply source to the plurality of pixels.

The data driver 250 supplies the data signals through the plurality of data lines. Here, the plurality of data lines are connected to the display panel 260 as a spider tie shape. Thus, the data signals are transmitted to the plurality of pixels in the display panel 260.

Each of the plurality of data lines forms a capacitor with the upper and lower power supply lines 210 and 230 in the display panel 260. Parasitic capacitance increases the load, causes signal loss, signal distortion, and signal delay, and thus it is preferable to minimize the parasitic capacitance.

The scan driver 240 generates the scan signals, and sequentially supplies the scan signals to the plurality of pixels in the display panel 260, thereby controlling the input/output of the data signals.

is a cross-sectional view of a signal input portion of the organic electroluminescent display taken along line I-I' of FIG. 2.

Figure 3:
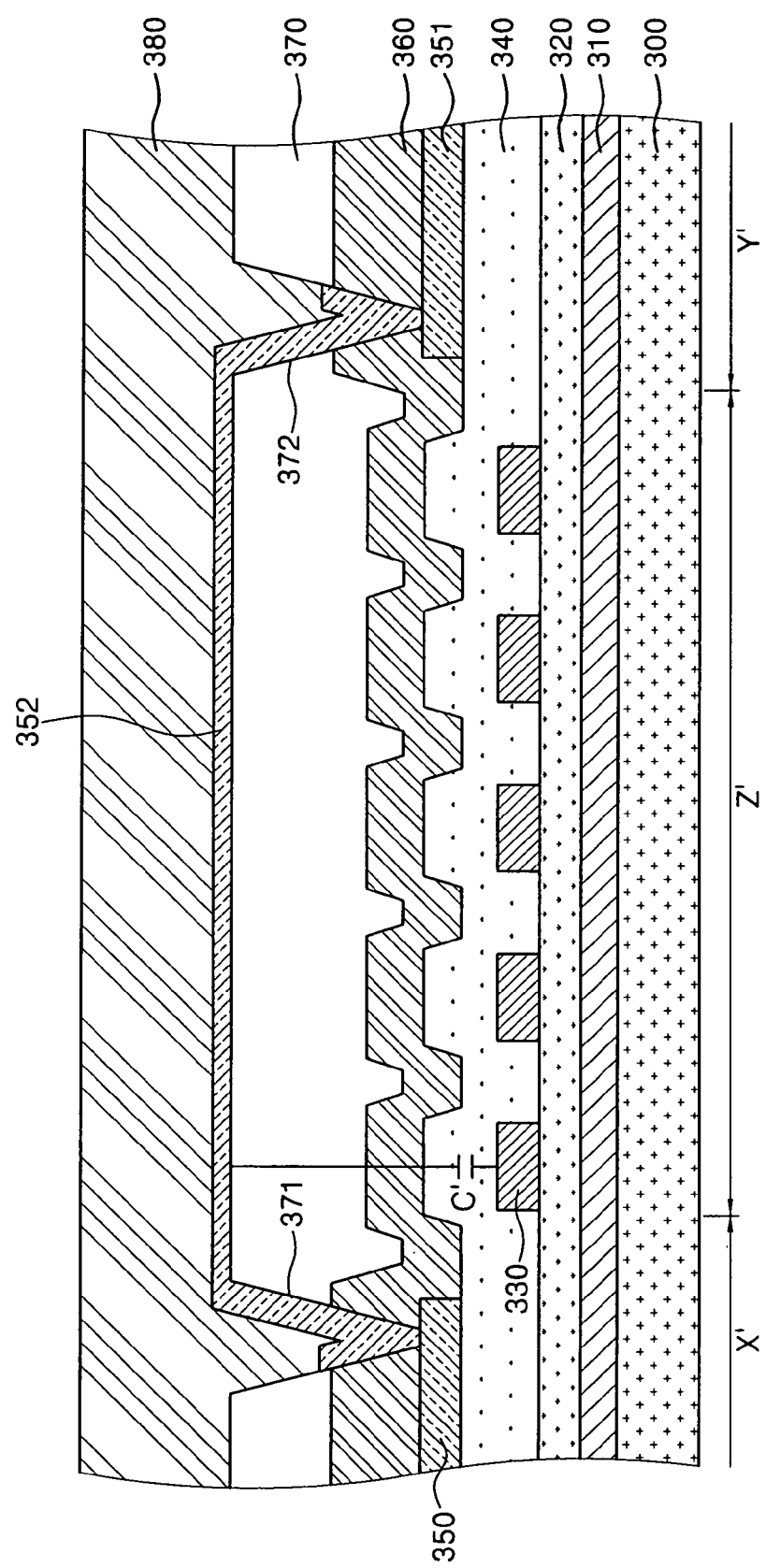
FIG. 3 is a cross-sectional view of a signal input portion of the organic electroluminescent display taken along line I-I' of FIG. 2.

Referring to FIG. 3, the cross-sectional view of the signal input portion provided in the organic electroluminescent display is divided into a first power supply line portion X', a second power supply line portion Y', and data lines portion Z'.

Further, FIG. 3 illustrates a plurality of data lines connecting a data driver and a display panel provided in the display panel portion of the organic electroluminescent display according to the first exemplary embodiment of the present invention. Here, the plurality of data lines are arranged in a spider tie shape to transmit a predetermined data signal to the display panel.

To manufacture a display panel portion like the embodiment shown in FIG. 3, a substrate 300 formed of glass, synthetic resin, or the like is prepared. Then, one of a silicon dioxide ($SiO_2$) layer, a silicon nitride ($SiN_x$) layer, and a stacked layer of the silicon dioxide/nitride layer is formed as a buffer layer 310 on the substrate 300, thereby preventing impurities from outflowing from the substrate 300.

Here, the buffer layer 310 is not essential and therefore is optional.

Then, a gate insulating layer 320 may be formed on the entire surface of the substrate 300 or the buffer layer 310. Further, a plurality of data lines 330 are patterned on the entire surface of the substrate 300.

In some embodiments, the data lines comprise at least one of chrome (Cr), molybdenum (Mo), aluminum (Al), silver (Ag), and alloys thereof.

Then, an interlayer-insulating layer 340 is formed on the gate insulating layer 320 and the plurality of data lines 330 in the data lines portion Z'. Another embodiment is a power supply electrode is then formed on the interlayer-insulating layer 340 in the first and second power supply lines portions X' and Y'. The power supply electrode is then patterned to form a first power supply line 350 corresponding to the first power supply line portion X' and a second power supply line 351 corresponding to the second power supply line portion Y'.

Then, one of a silicon dioxide ($SiO_2$) layer, a silicon nitride ($SiN_x$) layer, a stacked layer of the silicon dioxide/nitride layer, and the like is formed as a passivation layer 360 on the first power supply line 350 of the first power supply line portion X', the second power supply line 351 of the second power supply line portion Y', and the entire surface of the interlayer-insulating layer 340 of the data line portion Z'. The passivation layer 360 acts as a barrier to impurities, and may be formed of an organic layer, an inorganic layer, or a composite layer thereof.

Then, at least one of an acryl resin, a benzo-cyclo-butene (BCB) resin, a polyimid (PI) resin, a spin on glass (SOG) resin, an acrylate resin, a poly phenol resin, and the like is formed as an organic layer, i.e., a planarization layer 370, on the passivation layer 360. The planarization layer 370 provides a substantially planar top surface on which other layers may be subsequently formed.

The passivation layer 360 and the planarization layer 370 formed on the entire surface of the substrate are etched to form a first via hole 371 and a second via hole 372, respectively, thereby exposing the first power supply line 350 of the first power supply line portion X' and the second power supply line 351 of the second power supply line portion Y'.

Then, a pixel electrode 352 is deposited on the entire surface of the planarization layer 370 corresponding to the data lines portion Z', and the first power supply line 350 and the second power supply line 351 are connected through the first via hole 371 and the second via hole 372, respectively.

The pixel electrode 352 is separated and patterned from a pixel portion corresponding to the plurality of pixels. Thus, the pixel electrode 352 transmits the power supply voltage generated from the first and second power supply lines 350 and 351 connected through the first and second via holes 371 and 372 to the plurality of pixels formed in the display panel.

Here, the pixel electrode 352 is made of a transparent electrode material such as, but not limited to, indium tin oxide (ITO) or indium zinc oxide (IZO).

Then, a pixel defining layer (PDL) 380 is formed on the entire surface of the pixel electrode 352, and is configured to expose a portion of each of the pixels.

Here, the pixel defining layer 380 may comprise at least one organic material such as an acryl resin, a benzo-cyclo-butene (BCB) resin, a polyimid (PI) resin, a spin on glass (SOG) resin, an acrylate resin, a poly phenol resin and the like.

Figure 1:
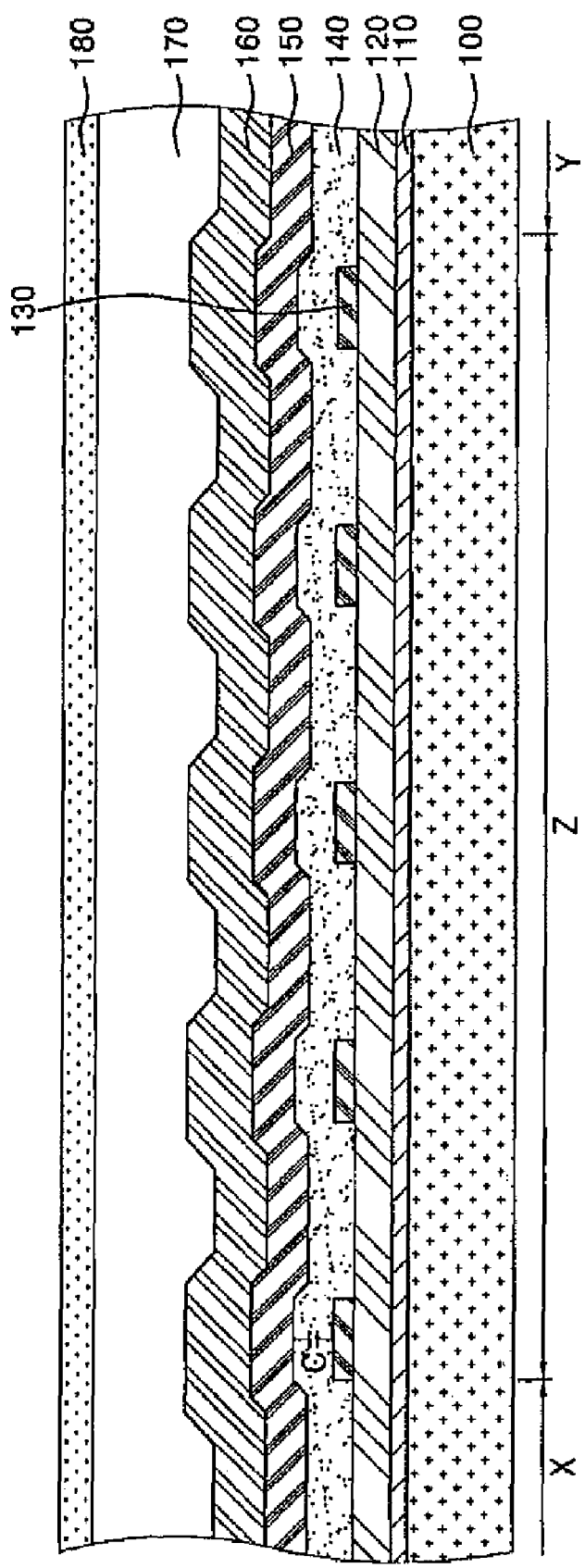
FIG. 1 is a cross-sectional view of a signal input portion for applying a signal to a display panel portion provided in a conventional organic electroluminescent display.

In some embodiments, the pixel electrode 352 is employed as the power supply line overlapping the plurality of data lines 330, so that the gap between the plurality of data lines 330 and the power supply line 352 is large, which notably decreases the parasitic capacitance C' compared to the conventional structure shown in FIG. 1.

Figure 4:
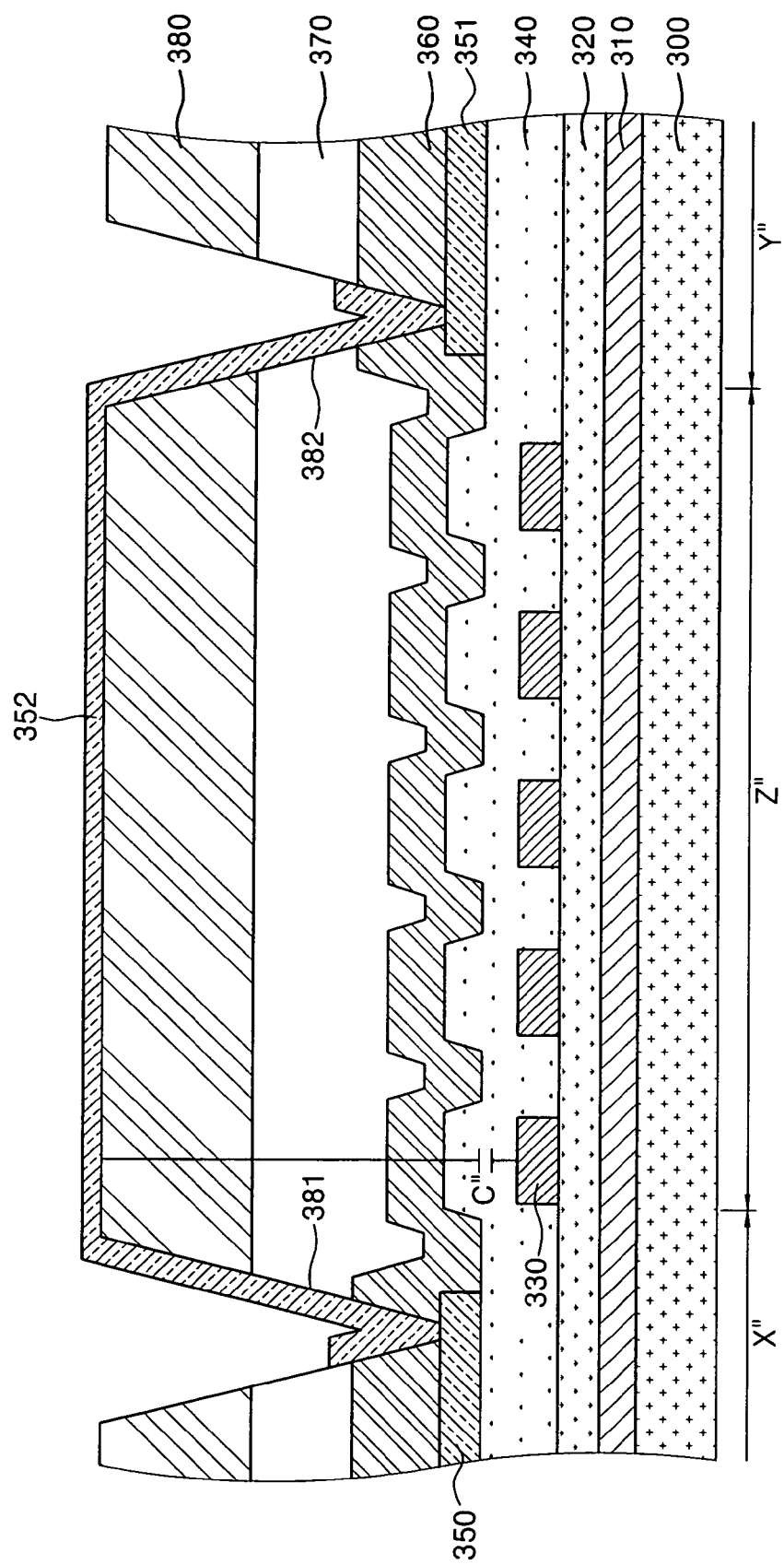
FIG. 4 is a cross-sectional view of a signal input portion of an organic electroluminescent display according to another embodiment taken along line I-I' of FIG. 2.

FIG. 4 is a cross-sectional view of another embodiment of a signal input portion of an organic electroluminescent display taken along line I-I' of FIG. 2.

Referring to FIG. 4, the cross-sectional view of the signal input portion provided in the organic electroluminescent display is divided into a first power supply line portion X", a second power supply line portion Y", and data lines portion Z".

Further, FIG. 4 illustrates a plurality of data lines connecting a data driver and a display panel in the display panel portion of the organic electroluminescent display. Here, the plurality of data lines are arranged in a spider tie shape to transmit a predetermined data signal to the display panel.

To manufacture a display panel portion such as that shown in FIG. 4, a substrate 300 formed of glass, synthetic resin or the like is prepared. Then, one of a silicon dioxide ($SiO_2$) layer, a silicon nitride ($SiN_x$) layer, a stacked layer of the silicon dioxide/nitride layer, and the like may be formed as a buffer layer 310 on the substrate 300, thereby preventing impurities from outflowing from the substrate 300.

Here, the buffer layer 310 is not essential and therefore is optional.

Then, a gate insulating layer 320 is formed on the entire surface of the substrate 300 or the buffer layer 310. Further, a plurality of data lines 330 are patterned on the entire surface of the substrate 300 or the gate insulating layer 320 to apply the data signals to the display panel.

In this embodiment, the data lines are made of at least one of chrome (Cr), molybdenum (Mo), aluminum (Al), silver (Ag), and alloys thereof.

Then, an interlayer-insulating layer 340 is formed on the gate insulating layer 320 and the plurality of data lines 330 in the data lines portion Z". Another embodiment is a power supply electrode is then formed on the interlayer-insulating layer 340 in the first and second power supply lines portions X" and Y". The power supply electrode is then patterned to form a first power supply line 350 corresponding to the first power supply line portion X" and a second power supply line 351 corresponding to the second power supply line portion Y".

Then, one of a silicon dioxide ($SiO_2$) layer, a silicon nitride ($SiN_x$) layer, a stacked layer of the silicon dioxide/nitride layer, and the like is formed as a passivation layer 360 on the first power supply line 350 of the first power supply line portion X", the second power supply line 351 of the second power supply line portion Y" and the entire surface of the interlayer-insulating layer 340 of the data lines portion Z".

Then, at least one of an acryl resin, a benzo-cyclo-butene (BCB) resin, a polyimid (PI) resin, a spin on glass (SOG) resin, an acrylate resin, a poly phenol resin, and the like is formed as an organic layer, i.e., a planarization layer 370, on the passivation layer 360.

Then, a pixel defining layer (PDL) 380 is formed on the entire surface of the substrate 300.

The pixel defining layer 380 comprises at least one organic material such as an acryl resin, a benzo-cyclo-butene (BCB) resin, a polyimid (PI) resin, a spin on glass (SOG) resin, an acrylate resin, a poly phenol resin, and the like.

The passivation layer 360, the planarization layer 370 and the pixel defining layer 380 formed on the entire surface of the substrate are etched to form a first via hole 381 and a second via hole 382, respectively, which exposes the first power supply line 350 of the first power supply line portion X" and the second power supply line 351 of the second power supply line portion Y".

Then, a cathode 352 is formed on the entire surface of the pixel defining layer 380 in the data line portion Z', and the first power supply line 350 and the second power supply line 351 are connected through the first via hole 381 and the second via hole 382, respectively.

The cathode 352 is separated and patterned from a pixel portion corresponding to the plurality of pixels. Thus, the cathode 352 transmits the power supply voltage from the first and second power supply lines 350 and 351 connected through the first and second via holes 381 and 382 to the plurality of pixels formed in the display panel.

Here, the cathode 352 comprises at least one of calcium (Ca), magnesium (Mg), silver (Ag), and alloys thereof.

In some embodiments, the cathode 352 is employed as the power supply line overlapping the plurality of data lines 330, so that the gap between the plurality of data lines 330 and the power supply line 352 is large, which notably decreases the parasitic capacitance C" compared to the conventional structure shown in FIG. 1.

According to the embodiments discussed herein, the portion of the power supply line overlapping the data line is employed as the pixel electrode or the cathode, so that the gap between the power supply line and the data line is enlarged compared to the convention structure, which decreases the parasitic capacitance and reduces the load on the data lines.

As described above, some embodiments provide an organic electroluminescent display in which a power supply line overlapping data lines of a signal input portion in a display panel portion is employed as a pixel electrode or a cathode, thereby reducing the parasitic capacitance and the load on the data lines.

Although the present invention has been described with reference to certain exemplary embodiments thereof, it will be understood by those skilled in the art that a variety of modifications may be made to the described embodiments without departing from the spirit or scope of the present invention.

What is claimed is:

1. An organic electroluminescent display, comprising:
   a substrate comprising a signal input portion configured to supply data signals and a power supply voltage to a plurality of pixels;
   a plurality of data lines arranged on a gate insulating layer formed on the substrate in the signal input portion;
   an interlayer-insulating layer formed over the plurality of data lines;
   a passivation layer formed on the interlayer-insulating layer over the plurality of data lines;
   a pixel electrode formed on the passivation layer over the plurality of data lines; and
   a pixel defining layer formed on the pixel electrode over the plurality of data lines,
   wherein the pixel electrode is configured to supply the power supply voltage to the plurality of pixels, and wherein the interlayer-insulating layer, the passivation layer and the pixel electrode overlap the data lines.

2. The organic electroluminescent display of claim 1, further comprising power supply lines formed and patterned in a region where the plurality of data lines are excluded, and between the interlayer-insulating layer and the passivation layer,
   wherein the pixel electrode is connected to the power supply line through via holes formed in the passivation layer.

3. The organic electroluminescent display of claim 1, wherein the pixel electrode includes a transparent electrode formed from at least one of ITO and IZO.

4. The organic electroluminescent display of claim 1, wherein the plurality of data lines comprise at least one of chrome (Cr), tungsten (W), molybdenum (Mo), aluminum (Al), silver (Ag), and alloys thereof.

5. The organic electroluminescent display of claim 1, wherein the plurality of data lines are connected to a display panel and are arranged in a spider tie shape.

6. The organic electroluminescent display of claim 1, further comprising a planarization layer formed on the passivation layer.

7. An organic electroluminescent display comprising:
   a substrate comprising a signal input portion configured to supply data signals and a power supply voltage to a plurality of pixels;
   a plurality of data lines arranged on the substrate in the signal input portion;
   an interlayer-insulating layer formed on the plurality of data lines;
   a passivation layer formed on the interlayer-insulating layer over the plurality of data lines;
   a pixel defining layer formed on the passivation layer over the plurality of data lines; and
   a cathode formed on the pixel defining layer over the plurality of data lines,
   wherein the cathode is configured to supply the power supply voltage to the plurality of pixels, and wherein the interlayer-insulating layer, the passivation layer and the pixel electrode overlap the data lines.

8. The organic electroluminescent display of claim 7, further comprising power supply lines formed and patterned in a region where the plurality of data lines is excluded, and between the interlayer-insulating layer and the passivation layer,
   wherein the cathode is connected to the power supply lines through via holes formed in the passivation layer and the pixel defining layer.

9. The organic electroluminescent display of claim 7, wherein the cathode is formed from at least one of calcium (Ca), magnesium (Mg), silver (Ag), and alloys thereof.

10. The organic electroluminescent display of claim 7, wherein the plurality of data lines are formed from at least one of chrome (Cr), tungsten (W), molybdenum (Mo), aluminum (Al), silver (Ag), and alloys thereof.

11. The organic electroluminescent display of claim 7, wherein the plurality of data lines are connected to a display panel and are arranged in a spider tie shape.

12. The organic electroluminescent display of claim 7, further comprising a planarization layer formed on the passivation layer.

13. An organic electroluminescent display comprising:
   a substrate;
   a plurality of data lines arranged on the substrate, wherein the data lines are configured to supply data signals to the plurality of pixels;
   a passivation layer formed over the data lines; and
   a pixel electrode formed over the passivation layer and over the plurality of data lines, wherein the pixel electrode is configured to supply a power supply voltage to each of the plurality of pixels,
   wherein the passivation layer and the pixel electrode overlap the data lines.

14. The organic electroluminescent display of claim 13, further comprising power supply lines formed and patterned in a region where the plurality of data lines are excluded, wherein the pixel electrode is connected to the power supply line through via holes formed in the passivation layer.

15. The organic electroluminescent display of claim 13, wherein the pixel electrode is formed from at least one of ITO and IZO.

16. The organic electroluminescent display of claim 13, wherein the plurality of data lines are formed from at least one of chrome (Cr), tungsten (W), molybdenum (Mo), aluminum (Al), silver (Ag), and alloys thereof.

17. The organic electroluminescent display of claim 13, wherein the plurality of data lines are connected to a display panel and are arranged in a spider tie shape.

18. The organic electroluminescent display of claim 13, further comprising a planarization layer formed over the passivation layer.

19. The organic electroluminescent display of claim 18, further comprising a pixel defining layer formed over the planarization layer.

20. The organic electroluminescent display of claim 18, wherein the pixel electrode is formed over the planarization layer.

* * * * *

UNITED STATES PATENT AND TRADEMARK OFFICE
CERTIFICATE OF CORRECTION

| | | |
|---|---|---|
| PATENT NO. | : 7,791,266 B2 | Page 1 of 1 |
| APPLICATION NO. | : 11/521703 | |
| DATED | : September 7, 2010 | |
| INVENTOR(S) | : Yang-Wan Kim | |

It is certified that error appears in the above-identified patent and that said Letters Patent is hereby corrected as shown below:

At Column 2, line 7, please delete "used" and insert therefore, --used.--

Signed and Sealed this
Nineteenth Day of April, 2011

David J. Kappos
*Director of the United States Patent and Trademark Office*